Oct. 28, 1969 H. M. MANASEVIT 3,475,209
SINGLE CRYSTAL SILICON ON CHRYSOBERYL
Filed Jan. 5, 1967 2 Sheets-Sheet 1

INVENTOR.
HAROLD M. MANASEVIT
BY Howard A. Silber
ATTORNEY

INVENTOR.
HAROLD M. MANASEVIT

United States Patent Office 3,475,209

Patented Oct. 28, 1969

3,475,209

SINGLE CRYSTAL SILICON ON CHRYSOBERYL

Harold M. Manasevit, Anaheim, Calif., assignor to North American Rockwell Corporation, a corporation of Delaware Filed Jan. 5, 1967, Ser. No. 607,437

Int. Cl. C23c *13/04;* C09d *5/24*

U.S. Cl. 117—201 5 Claims

ABSTRACT OF THE DISCLOSURE

Composites of single crystal semiconductors such as silicon epitaxially disposed on single crystal chrysoberyl are described. The composites are useful in the fabrication of multiple microelectronic components on a common substrate.

BACKGROUND OF THE INVENTION

Field of the invention

This invention relates to composites of thin monocrystalline films on substrates of chrysoberyl, and more particularly to a specific embodiment of the invention comprising single crystal silicon epitaxially disposed on a substrate of single crystal chrysoberyl.

Description of the prior art

In the fabrication of microelectronic devices on a single substrate, it is desirable to utilize high purity, single crystal semiconductor material such as silicon to form the active elements (e.g., diodes and transistors). In the past multiple microelectronc components have been formed directly in bulk silicon, for example, by diffusion through appropriate photoresist masks. Such structures, though widely used, have the disadvantage of considerable interdevice capacitance and relatively low interdevice resistance, both due to the properties of the bulk semiconductor substrate.

Several alternate approaches have been advanced to achieve dielectric isolation of active microelectronic components on a single substrate. For example, single crystal semiconductor segments may be embedded in a polycrystalline substrate. Another approach is to fabricate the microcircuits from a composite comprising a layer of single crystal semiconductor material epitaxially disposed on an electrically insulating, monocrystalline substrate. Chemical or mechanical etching techniques then may be used to form isolated islands of single crystal silicon from which individual, electrically isolated, electronic components may be fabricated.

Single crystal silicon of device purity has been successfully deposited in single crystal form on several electrically insulating monocrystalline substrates including sapphire, spinel, and beryllium oxide. Descriptions of these composites are included respectively in the co-pending applications to H. M. Manasevit, Ser. Nos. 403,439; 468,205, now U.S. Patent No. 3,414,434; and 523,217, all assigned to North American Aviation, Inc., the assignee of the present application.

SUMMARY OF THE INVENTION

The present invention comprises composites of single crystal materials such as silicon epitaxially disposed on chrysoberyl substrates.

DESCRIPTION OF THE PREFERRED EMBODIMENT

Figure 1:
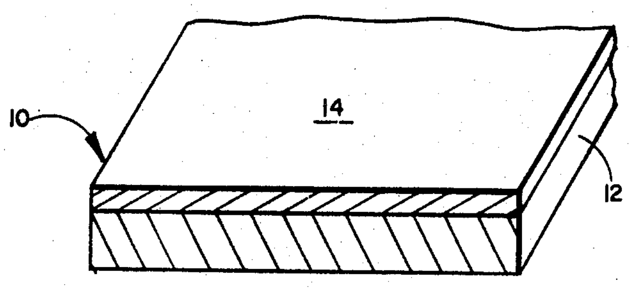
FIG. 1 is a perspective view of an embodiment of the inventive composite comprising a single crystal material epitaxially disposed on a chrysoberyl substrate.

FIG. 1 is a greatly enlarged view of one embodiment of the inventive composite. As shown in FIG. 1, the composite 10 includes a substrate 12 of chrysoberyl preferably monocrystalline, on which is epitaxially disposed a layer 14 of a single crystal material such as silicon. The lattice structures of chrysoberyl and silicon are described hereinbelow, and a method is set forth for preparing various embodiments of the inventive composite.

Chrysoberyl is a hard, dense gemstone which has the general formula $(A,B)_2BeO_4$ wherein A and B both may be trivalent ions, or alternately, where A represents a divalent ion and B represents a tetravalent ion. $Al_2BeO_4$ is the most common form of chrysoberyl; other relatively common forms include $(Al^{+3}, CR^{+3})BeO_4$ and $(Al^{+3}, Fe^{+3})BeO_4$. Chrysoberyl forms including divalent and tetravalent ions include, e.g., $(Mg^{+2}, Ti^{+4})_2BeO_4$. Generally, A and B represent metallic ions.

As a substrate, chrysoberyl offers certain advantages over both BeO and sapphire. For example, while sapphire and chrysoberyl exhibit similar thermal conductivity (an important consideration when determining the power dissipation possible with microcircuits constructed on the inventive composites) chrysoberyl may be grown from a melt at a temperature several hundred degrees lower than sapphire. In particular, sapphire has a melting point of 2030° C., while the melting point of chrysoberyl is about 1870° C. This implies that considerably less furnace power is required to produce chrysoberyl, and may result in chrysoberyl being a more economical substrate material than sapphire.

While BeO has a somewhat higher thermal conductivity than chrysoberyl, single crystal BeO (M.P.=2350° C.) is difficult to produce. When melt grown, BeO undergoes changes in crystalline structure which make it difficult to produce large volume single crystals. Chrysoberyl has not been reported to suffer from similar disadvantages.

Figure 2:
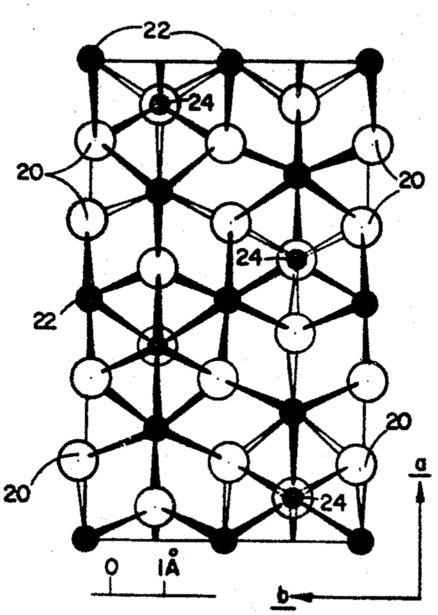
FIG. 2 is a diagram showing the crystalline structure of chrysoberyl as projected on the (001) crystallographic plane.

FIG. 2 is a diagram of the crystal lattice structure of $Al_2BeO_4$ chrysoberyl as projected on the (001) crystallographic plane. Chrysoberyl is a hexagonal closed-pack analog to the cubic spinel structure, with oxygen ions 20 forming a distorted hexagonal close packed array in which one-half of the octahedral sites are filled by aluminm ions 22 and one-eight of the tetrahedral interstices are occupied by beryllium ions 24. The chrysoberyl space group is orthorhombic with four molecules per cell unit. The chrysoberyl lattice parameters are $a$=9.40 A., $b$=5.48 A., and $c$=4.43 A. Indicated in FIG. 2 are the directions in which the $a$ and $b$ lattice parameters are measured.

Figure 3:
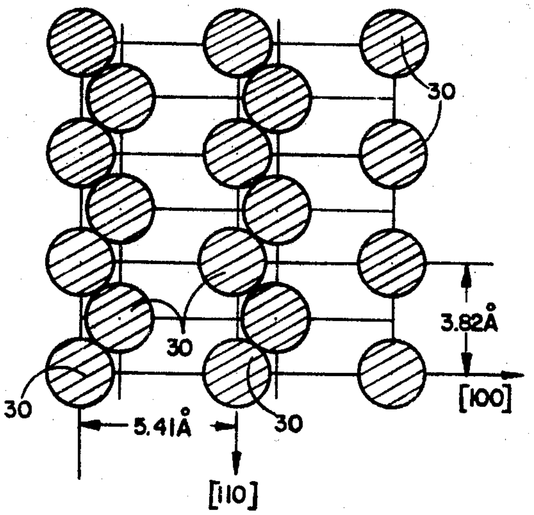
FIG. 3 is a diagram showing the crystalline structure of silicon as projected on the (110) crystallographic plane.

Silicon has a diamond cubic crystalline structure with a lattice parameter of 5.43 A. FIG. 3 is a diagram of the lattice structure of silicon, as projected on the (110) crystallographic plane. In FIG. 3 it may be seen that the spacing between silicon ions 30 in the (110) plane is 5.43 A. in the (001) crystallographic direction (corresponding to the lattice parameter) and 3.82 A. in the [110] crystallographic direction.

Comparison of the crystalline structures and lattice parameters of silicon and chrysoberyl suggests that epitaxy between the (110) crystallographic plane of chrysoberyl and the (100) plane of silicon should be possible; this combination has been observed, as described hereinbelow. Epitaxy is not limited to these planes, however, and other orientations suitable for epitaxy include, e.g., (110) silicon on (001) chrysoberyl. For the latter orientation, the silicon-silicon spacing (and lattice parameter) of 5.43 A. corresponds closely to 5.48 A., the sum of two aluminum-aluminum spacings along the chrysoberyl *b* direction (see FIG. 2), a mismatch of about 1.5 percent. In the orthogonal direction, the sum of two aluminum-aluminum spacings in chrysoberyl is about 9.40 A., as compared with 11.46 A., the sum of three silicon-silicon spacings; this suggests a mismatch of about 20 percent.

Epitaxial composites on a chrysoberyl substrate may be produced using techniques such as that described in the following example.

Synthetic $Al_2BeO_4$ having the form of a platelet and a surface corresponding to the (110) crystallographic plane was cleaned with successive washing treatments preliminary to having silicon deposited thereon. For silicon deposition, substrate 12 (see FIG. 1) was placed on a silicon pedestal in a reaction chamber, the pedestal being adapted for radio frequency (RF) heating. An aluminum oxide spacer, positioned between the pedestal and substrate 12, served to provide uniform heating of substrate 12 and to prevent direct transfer onto the underside of the substrate of silicon from the pedestal.

The chrysoberyl substrate was heated to the pedestal temperature of approximately 1275° C. (observed) for a preliminary hydrogen etch; this accomplished final cleaning of the surface of substrate 12. Hydrogen, purified by passage through a deoxidizer, a molecular sieve, a liquid nitrogen trap, and/or a palladium-silver thimble, advanced through the reaction chamber at a rate of about 3 liters per minute for a period of about 25 minutes.

The temperature of the pedestal supporting the chrysoberyl substrate next was reduced to about 1150° C. A thin film 14 of silicon was formed on substrate 12 by the decomposition of a mixture of 0.2 mole percent silane in hydrogen, passed into the reactor for a period of 30 to 60 seconds. Subsequently, hydrogen gas (at a flow rate of about 100 cubic centimeters per minute) was bubbled through liquid silicon tetrachloride maintained at 0° C. The stream of hydrogen and silicon tetrachloride then was passed through the reaction chamber for about 25 minutes. At all times the gas flow was directed toward the (110) deposition surface of the chrysoberyl substrate.

Examination of the composite produced by the technique described immediately hereinabove disclosed that a uniform film 14 of silicon, about 10 microns thick, covered the exposed surface of chrysoberyl substrate 12. X-ray analysis of the composite was carried out, and back reflection Laue patterns such as that shown in FIG. 4 were obtained. This analysis indicated that silicon film 14 was single crystal, and that the (100) crystallographic plane of silicon was disposed epitaxially on the (110) crystallographic plane of chrysoberyl.

Figure 4:
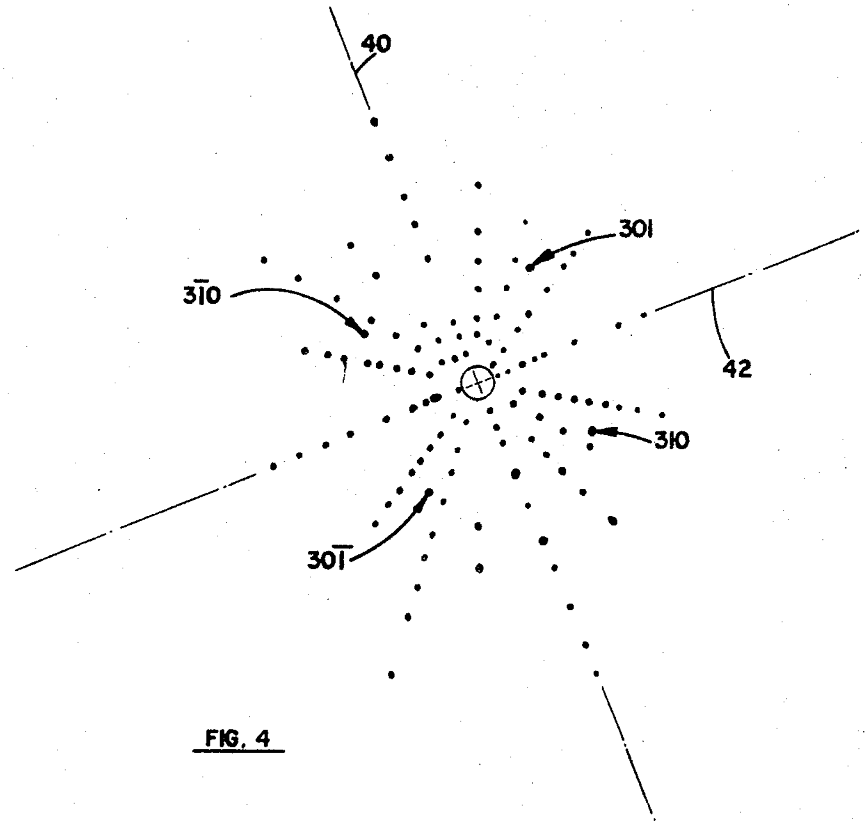
FIG. 4 shows a Laue pattern obtained during X-ray analysis of a composite of silicon epitaxially disposed on a chrysoberyl substrate; spots indicative of specific silicon planes are designated in the figure.

Referring to FIG. 4 there is shown a Laue pattern obtained by X-ray back reflection from an embodiment of the inventive composite comprising a film 14 of silicon disposed on chrysoberyl substrate 12. The Laue pattern was obtained using an X-ray beam incident normal to the interface between the silicon and the chrysoberyl. Techniques for interpreting such Laue patterns are well known to those skilled in the art, and are described, for example, at pages 211 to 217, of the book entitled Structure of Metals by Charles S. Barrett and T. B. Massalski, published by McGraw-Hill in 1966.

As may be seen in FIG. 4, the rows of spots designated by the numerals 40 and 42 comprise orthogonal $\langle 110\rangle$ zones in silicon. Each spot corresponds to a reflection from a particular plane in the zone. The spots along zones 40 and 42 as well as the other spots which may be seen in the Laue pattern are identifiable by reference to standard stereographic projections for cubic crystals. Such a projection of poles and zones is illustrated, e.g., at page 39 of the book Structure of Metals referenced hereinabove. In FIG. 4, the spots corresponding to the (301), (310), $(30\bar{1})$, and $3\bar{1}0$) planes in silicon are identified. Other spots which appear in the Laue pattern (which are not designated in FIG. 4) include those corresponding to the (511), $(5\bar{1}1)$, $(51\bar{1})$, and $5\bar{1}\bar{1}$) crystallographic planes; these poles lie along $\langle 110\rangle$ zones 40 and 42.

The positions of the various spots identified in the Laue pattern of FIG. 4 indicate that the (100) crystallographic plane of silicon was normal to the X-ray beam. Since the X-ray beam was normal to the interface between silicon layer 14 and chrysoberyl substrate 12, this implied that the deposited silicon was oriented with its (100) crystallographic plane parallel to the (110) chrysoberyl plane on which the silicon had been deposited.

I claim:

1. In combination, a substrate of single crystal chrysoberyl and a layer of single crystal silicon epitaxially disposed on said substrate.

2. A composite as defined by claim 1 wherein said chrysoberyl has the formula $(A,B)_2BeO_4$, wherein said symbols A and B each represent metallic ions.

3. A composite as defined by claim 1 wherein said chrysoberyl has the formula $Al_2BeO_4$.

4. A composite according to claim 3 wherein the (100) crystallographic plane of said silicon is disposed on the (110) crystallographic plane of said chrysoberyl.

5. A composite according to claim 3 wherein the (110) crystallographic plane of said silicon is disposed on the (001) crystallographic plane of said chrysoberyl.

References Cited

UNITED STATES PATENTS 3,312,572 4/1967 Norton et al.

ANDREW G. GOLIAN, Primary Examiner

U.S. Cl. X.R.

117—106, 169